United States Patent
Boskamp (10) Patent No.: US 6,885,194 B2
(45) Date of Patent: Apr. 26, 2005

(54) METHOD AND APPARATUS FOR MINIMIZING GRADIENT COIL AND RF COIL COUPLING

(75) Inventor: Eddy B. Boskamp, Menomonee Falls, WI (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 275 days.

(21) Appl. No.: 10/138,858

(22) Filed: May 3, 2002

(65) Prior Publication Data

US 2003/0206017 A1 Nov. 6, 2003

(51) Int. Cl.$^7$ ................................................ G01S 3/00
(52) U.S. Cl. ..................................... 324/318; 324/309
(58) Field of Search ............................. 324/318, 320, 324/319; 600/422

(56) References Cited

U.S. PATENT DOCUMENTS 5,990,681 A * 11/1999 Richard et al. ............. 324/318
6,498,947 B1 * 12/2002 Boskamp et al. ........... 600/422

OTHER PUBLICATIONS

K. Beresten et al., RF Coil Interaction and its Effect on SNR and Homogeneity, Proceedings ISMRM, p. 1095, (1994).
Ed B. Boskamp et al., Gaining Space with an Embedded Rf Body Coil Shield, Proc. Int'l. Soc. Mag. Reson. Med 9 (2001), p. 1122.

* cited by examiner

Primary Examiner—Brij B. Shrivastav
(74) Attorney, Agent, or Firm—Fletcher Yoder (57) ABSTRACT

A method and apparatus are provided which reduce coupling between a Z-axis gradient coil and an rf coil in magnetic resonance imaging systems and an rf shield disposed between the Z-axis gradient coil and the remaining gradient coils. The reduction in coupling is accomplished by novel windings of conductor forming the Z-axis gradient coil.

5 Claims, 5 Drawing Sheets

METHOD AND APPARATUS FOR MINIMIZING GRADIENT COIL AND RF COIL COUPLING

BACKGROUND OF THE INVENTION

The present invention relates generally to the field of medical diagnostic imaging. More particularly, the present invention relates to the magnetic resonance imaging and to the reduction of noise within magnetic resonance imaging systems incorporating ultra-short cylindrical magnets.

Magnetic resonance imaging (MRI) systems have become ubiquitous in the field of medical diagnostics. Over the two past decades, improved techniques for MRI examinations have been developed that now permit very high-quality images to be produced in a relatively short time. As a result, diagnostic images with varying degrees of resolution are available to the radiologist that can be adapted to particular diagnostic applications.

In general, MRI examinations are based on the interactions among a primary magnetic field, a radiofrequency (rf) magnetic field and time varying magnetic gradient fields with nuclear spins within the subject of interest. Specific nuclear components, such as hydrogen nuclei in water molecules, have characteristic behaviors in response to external magnetic fields. The precession of spins of such nuclear components can be influenced by manipulation of the fields to obtain rf signals that can be detected, processed, and used to reconstruct a useful image.

The magnetic fields used to produce images in MRI systems include a highly uniform, static magnetic field that is produced by a primary magnet. A series of gradient fields are produced by a set of three gradient coils disposed around the subject. The gradient fields encode positions of individual volume elements or voxels in three dimensions. A radiofrequency coil is employed to produce an rf magnetic field. This rf magnetic field perturbs the spin system from its equilibrium direction, causing the spins to precess around the axis of their equilibrium magnetization. During this precession, radiofrequency fields are emitted by the spins and detected by either the same transmitting rf coil, typically a birdcage resonator, or by a separate receive-only coil. These signals are amplified, filtered, and digitized. The digitized signals are then processed using one of several possible reconstruction algorithms to reconstruct a useful image.

Many specific techniques have been developed to acquire MR images for a variety of applications. One major difference among these techniques is in the way gradient pulses and rf pulses are used to manipulate the spin systems to yield different image contrasts, signal-to-noise ratios, and resolutions. Graphically, such techniques are illustrated as "pulse sequences" in which the pulses are represented along with temporal relationships among them. In recent years, pulse sequences have been developed which permit extremely rapid acquisition of a large amount of raw data. Such pulse sequences permit significant reduction in the time required to perform the examinations. Time reductions are particularly important for acquiring high-resolution images, as well as for suppressing motion effects and reducing the discomfort of patients in the examination process.

While field interactions are fundamental to the encoding of data acquired in MRI systems, certain field interactions are undesirable, or may lead to degradation of the image data. For example, when the appropriate pulses are applied to an rf coil during an examination sequence, rf energy from the rf coil can penetrate the gradient coil structure where it is dissipated by lossy eddy currents induced in the gradient coil structure. To maintain a high efficiency of the rf coil, an rf shield is typically positioned between the rf coil and the gradient coil set so as to prevent or reduce penetration of the rf magnetic field into all of the gradient coils. The design of the rf shield is such that minimal eddy currents are generated by switching of the gradient fields, rendering the rf shield substantially transparent to the gradient fields. At the same time, the rf frequencies are much higher than characteristic eddy current decay rates in the shield, hence the shield functions like an impenetrable barrier to rf fields. However, the proximity of an rf shield to the if coil conductors, particularly in the case of a whole body rf transmit coil, may significantly affect the overall power efficiency and the signal-to-noise ratio of the rf coil. Therefore, in general, it is desirable to place the rf shield as far as possible from the rf coil.

To address these concerns, the rf shield may be placed between the gradient coils such that the Z-axis gradient coil, typically an antisymmetric solenoid-type coil of varying pitch, is positioned within the shield, that is, between the shield and the rf transmit coil. This configuration is possible because the mode of the rf coil that is typically used in MRI has little or no net magnetic flux in the Z-axis direction, resulting in minimal coupling between the rf coil and the Z-axis gradient coil. In this configuration, the radiofrequency field is essentially undisturbed by the presence of the Z-axis gradient coil on the interior of the shield surface, allowing the rf shield to be moved significantly away from the transmit coil and thereby providing a significant reduction in noise and an increase in efficiency.

This configuration, however, may be unacceptable in systems using ultra-short cylindrical magnets where the spacing between the windings of the Z-axis gradient coil is drastically reduced. At this reduced spacing, a number of factors appear to prevent proper decoupling of the high-density z-gradient coil from the rf coil. First, in such systems the distance between the rf coil conductors and the Z-axis gradient conductors may be as little as 10 mm, resulting in frequent misalignment, either radially or in the direction of the Z-axis, which leads to coupling between the rf coil and the Z-axis gradient coil. Second, coupling occurs between the end rings of the birdcage resonator and the Z-axis gradient windings as they pass over the end rings. Finally, the quality factor, or Q, associated with the system depends upon the angle between the conductive "rungs" of the birdcage resonator and the connecting wire which connects the 2 antisymmetric halves of the Z-axis gradient coil. In particular, Q is reduced each time the connecting wire passes above one of the birdcage rungs.

There is a need, therefore, for an improved technique for winding a Z-axis gradient. To address the drawbacks in hereto foreknown systems, there is a particular need for a technique which minimizes interactions between the z-gradient and the birdcage rf body coil in systems employing ultra-short cylindrical magnets and a rf shield outside of the Z-axis gradient coil.

BRIEF DESCRIPTION OF THE INVENTION

The present invention provides a Z-axis gradient winding technique designed to respond to such needs. The technique may be employed in a wide range of systems, but is particularly suitable to magnetic resonance imaging systems employing ultra-short cylindrical magnets, such as those used in medical diagnostic applications. The technique may also be employed in any suitable MRI scanner design, including full body scanners, open scanners, and scanners with a range of field ratings. Where appropriate, the technique may be used to retrofit existing scanners, or may be incorporated into new designs, particularly in the configuration of the gradient coil structure.

The technique makes use of novel windings for Z-axis gradient coils. In one embodiment, a gap is formed in the Z-axis gradient coil winding over each birdcage coil end ring. A straight connecting wire is then used to cross the gap in the least distance, reducing the coupling between the rf coil and the Z-axis gradient coil attributable to the end rings to a minimum. In a second embodiment, the antisymmetric halves of the Z-axis gradient coil are connected across the isocenter with a spirally wound connector. The spiral winding of the connector distributes any coupling attributable to the connector among all of the rungs of the birdcage rf body coil. The technique has been demonstrated to provide a significant reduction in coupling between the Z-axis gradient coil and the rf coil when these coils are disposed radially interior of an rf shield.

In accordance with one aspect of the present invention, a system is provided utilizing a novel gradient coil winding. The system possesses an rf coil consisting of end rings with rungs running between the end rings and a gradient coil disposed about the rf coil. The gradient coil comprises a gradient conductor wound as a solenoid coil and is wound such that there is a gap in the winding above each end ring of the rf coil which is crossed by a portion of the conductor.

In accordance with another aspect of the present invention, a system is provided utilizing a novel gradient coil winding. The system possesses an rf coil consisting of end rings with rungs running between the end rings and a gradient coil disposed about the rf coil. The gradient coil comprises a gradient conductor wound as a solenoid coil symmetric about the isocenter of the gradient field produced by the gradient coil such that there is a positive and negative half of the symmetric solenoid coil which are connected by a symmetric, spirally wound connecting wire formed of a segment of the gradient conductor.

In accordance with another aspect of the present invention, a system is provided utilizing a novel gradient coil winding. The system possesses an inner tube formed by a birdcage rf coil comprising a pair of end rings connected by spaced apart rungs. The system also possesses an outer tube disposed about the inner tube and formed by a gradient coil comprising a conductive element wound to form a solenoid coil with a gap above each end ring crossed by a minimum amount of the conductive element. The winding of the solenoid coil is reversed at a transverse plane bisecting the coil such that the conductive element crossing the transverse plane is a symmetric, spirally wound segment which circles the inner tube in multiples of one half of a turn prior to reversing.

In accordance with another aspect of the present invention, a gradient coil is provided comprising a conductor wound as a solenoid coil in which the winding is reversed at the isocenter of a field generated by the gradient coil such that a first winding exists prior to the reversal and a second winding exists subsequent to the reversal. The transition from the first winding to the second winding is accomplished by a spirally wound segment of the conductor which passes around a whole body rf coil at least one half of a turn prior to reversing.

In accordance with another aspect of the present invention, a coil is provided comprising a conductor wound as a solenoid coil in which the winding is reversed at the isocenter of a field generated by the coil such that a first winding exists prior to the reversal and a second winding exists subsequent to the reversal. The winding of the coil includes a pair of gaps, one on either side of the isocenter, such that each gap is situated so that the solenoid coil is not wound above a pair of end rings of an underlying whole body rf coil. A minimum amount of conductive material crosses each gap.

In accordance with another aspect of the present invention, a method of winding a gradient coil is provided in which the coupling between the gradient coil and a rf coil is reduced. The method includes winding a conductor about the rf coil to form a solenoid coil and forming a spiral of the conductor as the location of the desired isocenter for a gradient field produced by the gradient coil is approached such that the spiral passes around the rf coil in increments of half of a turn prior to reversing. At the location of the desired isocenter, the winding of the solenoid coil is reversed, forming a symmetric solenoid coil, including a reversed spiral, about the desired isocenter.

In accordance with another aspect of the present invention, a method of winding a gradient coil is provided in which the coupling between the gradient coil and a rf coil is reduced. The method includes winding a conductor about the rf coil to form a solenoid coil and forming a gap in a portion of the solenoid coil disposed above an end ring of the rf coil such that the gap is crossed by a length of the conductor. At the location of the desired isocenter, the winding of the solenoid coil is reversed, forming a symmetric solenoid coil about the desired isocenter.

In accordance with another aspect of the present invention, a magnetic resonance imaging system is provided. The magnetic resonance imaging system includes a rf coil comprised of two end rings connected by rungs and a gradient coil disposed about the rf coil comprising a gradient conductor generally wound as a symmetric solenoid coil in which the winding is reversed at the desired isocenter of a gradient field produced by the gradient coil. The system also includes a means for decoupling a portion of the gradient coil from an underlying end ring.

In accordance with another aspect of the present invention, a magnetic resonance imaging system is provided. The magnetic resonance imaging system includes a rf coil comprised of two end rings connected by rungs and a gradient coil disposed about the rf coil comprising a gradient conductor generally wound as a symmetric solenoid coil in which the winding is reversed at the desired isocenter of a gradient field produced by the gradient coil. The system also includes a means for distributing among the rungs any coupling between a segment of the gradient conductor and the rf coil such that the coupling is distributed substantially equally among the rungs.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
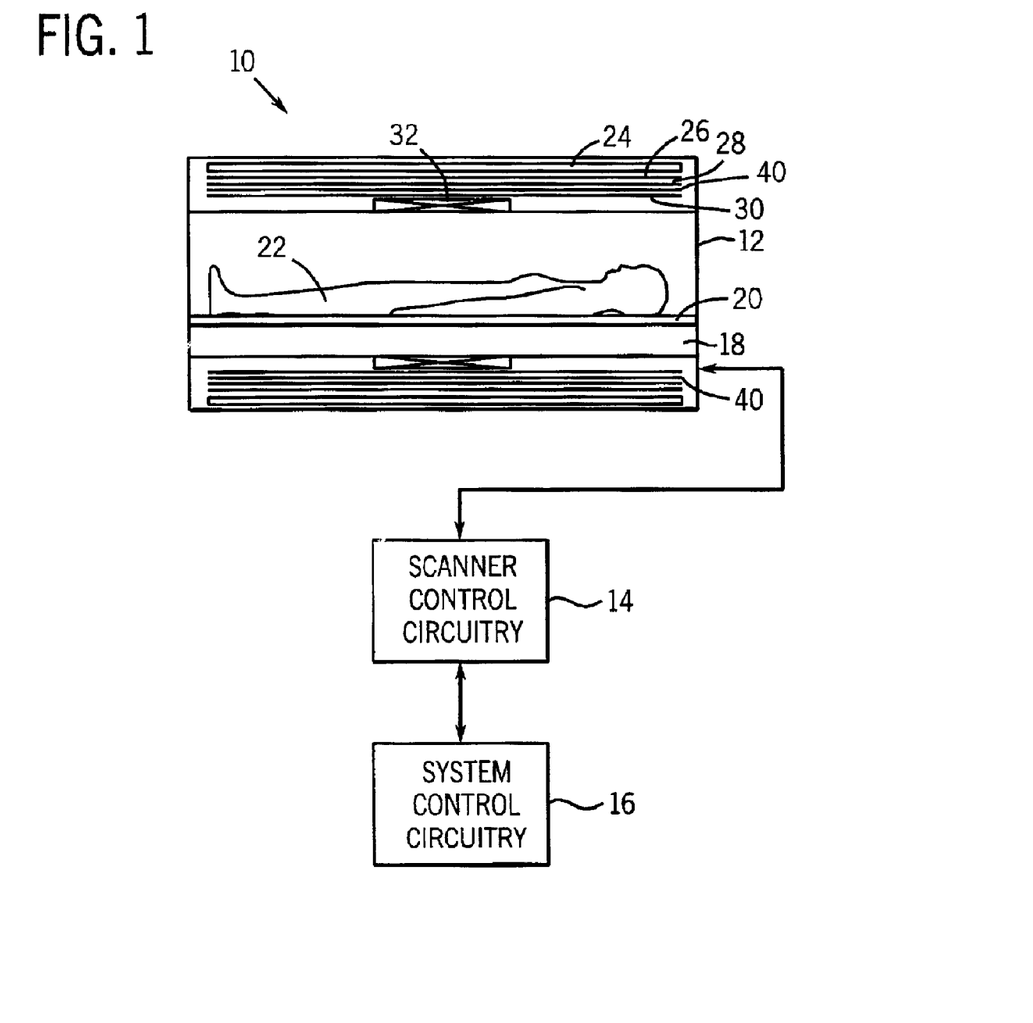
FIG. 1 is a diagrammatical representation of an MRI system for use in medical diagnostic imaging and implementing certain aspects of the present shielding technique.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising a patient bore 18 into which a table 20 may be positioned to place a patient 22 in a desired position for scanning. The scanner 12 may be of any suitable type of rating, including scanners varying from 0.5 Tesla ratings to 1.5 Tesla ratings and beyond.

The scanner 12 includes a series of associated coils for producing controlled magnetic fields, for generating radiofrequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radiofrequency coil 32 is provided for generating radiofrequency pulses for exciting the gyromagnetic material.

Figure 2:
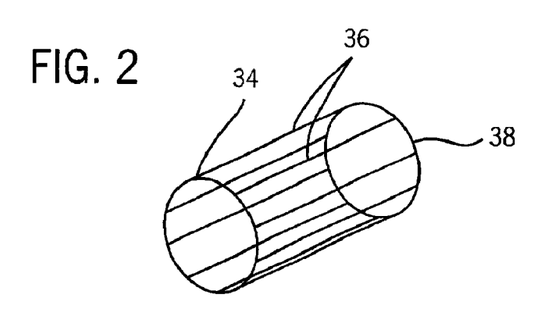
FIG. 2 is a diagrammatical representation of an exemplary whole body rf coil.

In a present embodiment, a birdcage coil structure 34, illustrated in FIG. 2, is employed as an exemplary whole body coil. As will be appreciated by those skilled in the art, such coil structures include longitudinal conductors 36 and conductive end rings 38. Pulses applied to the conductors are driven at a desired frequency, such as 64 MHz, to excite a particular mode of the rf coil 32.

Referring once again to the embodiment illustrated in FIG. 1, the rf coil 32 also serves as a receiving coil. Thus, the rf coil 32 may be coupled with driving and receiving circuitry in passive and active modes for receiving emissions from the gyromagnetic material and for applying radiofrequency excitation pulses, respectively. Alternatively, various configurations of receiving coils may be provided separate from the rf coil 32. Such coils may include structures specifically adapted for target anatomies, such as head coil assemblies, and so forth. Moreover, receiving coils may be provided in any suitable physical configuration, including phased array coils, and so forth. A radiofrequency shield 40 (see, e.g., FIG. 4) may be positioned between the gradient coils 26, 28 and 30 to shield the rf coil 32 from the presence of certain of the gradient coils during operation. In particular, the rf shield 40 prevents the rf magnetic field from entering certain of the gradient coils, as discussed below, which would negatively affect the efficiency of the rf coil 32

In a present configuration, the gradient coils 26, 28 and 30 have different physical configurations adapted to their function in the imaging system 10. As will be appreciated by those skilled in the art, the coils 26, 28 and 30 are comprised of conductive wires, bars or plates which are wound or cut to form a coil structure which generates a gradient field upon application of control pulses as described below. The placement of the coils within the gradient coil assembly may be done in several different orders, but in the present embodiment, a Z-axis coil is positioned at an innermost location, and is formed generally as an antisymmetric solenoid-like structure. Thus, in the illustrated embodiment, gradient coil 30 is the Z-axis solenoid coil, while coils 26 and 28 are Y-axis and X-axis coils respectively. In the present configuration, the rf shield 40 is positioned between Z-axis coil 30 and X-axis coil 28.

The coils of scanner 12 are controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the magnetic moment in a perpendicular plane generally cancel one another. During an examination sequence, an rf frequency pulse is generated at or near the Larmor frequency of the material of interest, resulting in rotation of the net aligned magnetic moment to produce a net transverse magnetic moment. This transverse magnetic moment precesses around the main magnetic field direction, emitting rf signals that are detected by the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions can be applied along the X-, Y- and Z-axis of the original coordinate system or along other axes determined by combinations of pulsed currents applied to the individual field coils.

The slice select gradient determines a slab of tissue or anatomy to be imaged in the patient. The slice select gradient field may be applied simultaneously with a frequency selective rf pulse to excite a known volume of spins within a desired slice that precess at the same frequency. The slice thickness is determined by the bandwidth of the rf pulse and the gradient strength across the field of view.

The frequency encoding gradient is also known as the readout gradient, and is usually applied in a direction perpendicular to the slice select gradient. In general, the frequency encoding gradient is applied before and during the formation of the MR echo signal resulting from the rf excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing spins of the material using slightly different gradient amplitudes that are sequentially applied during the data acquisition sequence. The phase encode gradient permits phase differences to be created among the spins of the material in accordance with their position in the phase encode direction.

As will be appreciated by those skilled in the art, a great number of variations may be devised for pulse sequences employing the exemplary gradient pulse functions described above as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radiofrequency pulses. The scanner control circuitry 14 may include one or more control circuits for commanding the pulse sequences employed during the examinations, and for processing received signals. The control circuits may include any suitable programmable logic device, such as a CPU or digital signal processor of a general purpose or application-specific computer as well as memory circuitry. The memory circuitry is typically of a type suitable for storing physical and logical axis configuration parameters, examination pulse sequence descriptions, acquired image data, programming routines, and so forth, used during the examination sequences implemented by the scanner. The scanner control circuitry 14 may also include amplification and control circuitry and transmission and receive circuitry which allows interface between the control circuits and the coils of scanner 12. Finally, scanner control circuitry 14 includes interface components for exchanging configuration and image data with system control circuitry 16.

System control circuitry 16 may include a wide range of devices for facilitating interface between an operator or radiologist and scanner 12 via scanner control circuitry 14. For example, an operator controller may be provided in the form of a computer workstation employing a general purpose or application-specific computer which may store pulse sequence descriptions, examination protocols, or patient and image data. The workstation may further include various interface and peripheral drivers for both local and remote exchanges of data. Typical inputs may be accomplished via a keyboard or mouse. Typical outputs may be via a printer or computer monitor 48. Additional data exchanges may include various local and remote image access and examination control devices such as picture archiving and communication systems, teleradiology systems, and the like.

Figure 3:
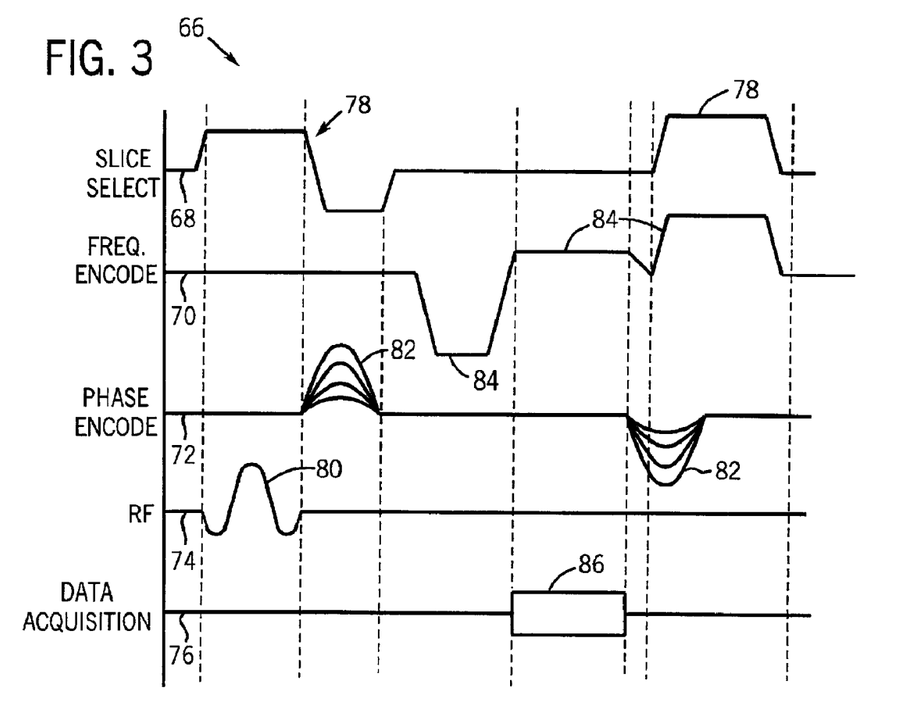
FIG. 3 is a graphical representation of an exemplary pulse sequence description for an MRI examination which may be implemented in the system of FIG. 1.

In general, pulse sequences implemented in the MRI system will be defined by both functional and physical configuration sets and parameter settings stored within control circuitry 14. By way of example, FIG. 3 illustrates a typical pulse sequence which may be implemented on a system such as that illustrated in FIG. 1. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a slice select axis 68, a frequency encoding axis 70, a phase encoding axis 72, an rf axis 74, and a data acquisition axis 76. In general, the pulse sequence description begins with a pair of gradient pulses on slice select axis 68 as represented at reference numeral 78. During a first of these gradient pulses, an rf pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

During the examination sequences such as the exemplary sequence described above, electromagnetic interactions, such as rf coupling between the rf and gradient coils, may adversely affect the operation of the system. For example, the presence of the gradient coils (particularly the X and Y-axis coils) will increase the series resistance of the rf coil and may alter its frequency due to inductive and capacitive coupling. Moreover, the efficiency of the rf coil and the signal-to-noise ratio may be jeopardized. Such interactions may also significantly affect the rf magnetic field if allowed to penetrate into the lossy material making up the gradient coils. In particular, it has been found that the X-axis coil 26 and the Y-axis coil 28 have strong interactions with the rf field if the if field is allowed to penetrate into those regions of the gradient coil. This leads to undesirable rf losses and a reduction in performance (efficiency and Q, a common performance measure) of the rf coil. One solution to this problem is to position an rf shield 40 at an intermediate position within the gradient coil assembly, as illustrated in FIG. 4.

Figure 4:
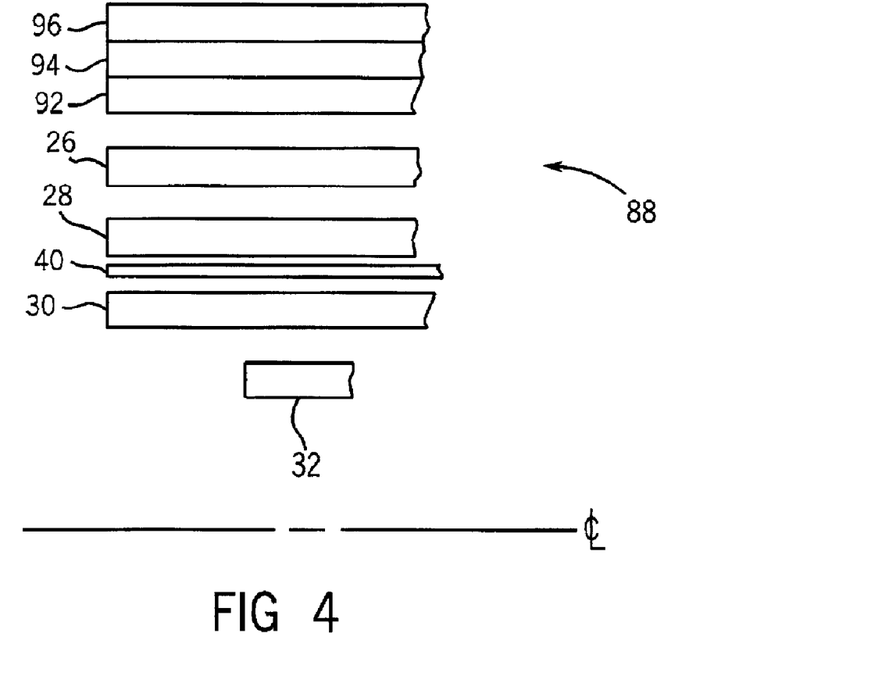
FIG. 4 is a diagrammatical representation of the layout of gradient coils and an rf shield between the gradient coils.

Referring to FIG. 4, the coil assembly 88 includes the inner gradient coils 26, 28 and 30 described above, and an rf shield 40 placed between the innermost gradient coil 30 and the next adjacent gradient coil 28. In a present embodiment, the innermost gradient coil 30 is a modified solenoid-type coil, such as the Z-axis coil. The rf shield 40 may be any suitable form of shield such as one or more thin sheets of conductive material, such as copper. Alternative forms of rf shields may be adapted to the specific scanner structure. Examples of such scanner structures include cylindrical and planar structures such as those used in open MRI systems. In each of these cases, however, the rf shield 40 is placed within the gradient coils to take advantage of the relatively minor influence of the transverse rf magnetic field on the solenoid-type or Z-axis coil 30, and to position the shield at an advantageously greater distance from the rf coil 32.

As noted above, in accordance with the present technique, any suitable form of rf shield 40 may be provided at the locations described. For example, the shield 40 effectively appears as a solid cylinder that is impenetrable at rf frequencies, at least in the cylindrical arrangement illustrated. However, the shield 40 may include openings or voids which render the shield 40 more transparent to gradient magnetic fields. These openings or voids are generally designed to preserve as well as possible the shielding effect on the rf fields. The shield 40 also may include multiple layers of material with capacitance between the layers, such that at the rf frequencies employed in operation the shield 40 functions as a solid shield. In another implementation, the shield 40 may be formed of a single layer of copper mesh, the mesh size and thickness being chosen such that the shield 40 reflects at rf frequencies and yet is transparent for the gradient fields.

In the present embodiment, illustrated in FIG. 4, outer gradient coils are provided beyond the inner gradient coils. These outer gradient coils, designated by reference numerals 92, 94 and 96 in FIG. 4, make up the remainder of the gradient coil structure. The function of the outer gradient coils is to cancel the gradient magnetic fields, as well as possible, in the regions outside the gradient tube assembly to minimize interaction with components of the cryostat structure and other metallic parts of the magnet structure. As will be appreciated by those skilled in the art, each gradient coil of the structure includes one or more conductive elements supported on a support structure, such as a fiberglass resin composite tube.

Because the gradient coils 26 and 28 are very lossy at the rf frequencies employed in the pulse sequences, the rf shield 40 prevents or greatly reduces the penetration of the rf field into these coils, thereby avoiding the loss of energy. It should be noted that the positioning of the rf shield 40 between coils 28 and 30 in the coil assembly 88 increases the distance between the rf coil 32 and the shield 40. Increasing the distance between rf coil 32 and rf shield 40 permits reductions in the amount of energy which may be supplied to the rf coil to obtain the desired magnetic field strength. Moreover, by distancing the rf shield from the rf coil through its position intermediate the gradient coils, a significant improvement in the signal-to-noise ratio and the efficiency can be obtained. Thus, the system may be provided with a reduced-size rf amplifier, and problems associated with higher rf energies in heretofore known systems are avoided.

In addition, placing the rf shield 40 within the gradient coil assembly 88 enhances the efficiency of the gradient coils. In particular, the configuration permits the primary gradient coils to be placed a reduced distance from the longitudinal center line of the field system, improving the efficiency of the gradient coils. Indeed, the efficiency of a gradient coil is extremely sensitive to the distance between the primary gradient windings and the gradient shielding windings. Thus, by reducing the distance between the primary gradient coils and the longitudinal center line, the distance between the primary and shield windings of all three gradient coils may be increased, significantly improving the efficiency of all three gradient coil assemblies.

Figure 5:
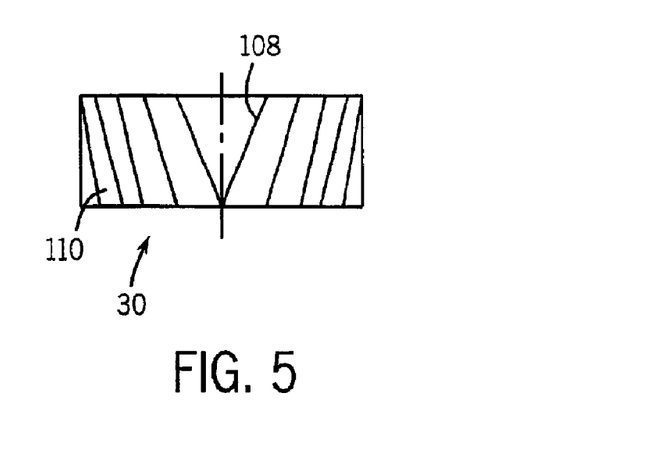
FIG. 5 is a diagrammatical representation of an exemplary Z-axis gradient coil which may be used in a whole body coil structure.

As will be appreciated by those skilled in the art, the Z-axis coil 30, located inward of the rf shield 40, is formed generally as a modified wound solenoid coil with progressive turns of the solenoid conductor being spaced at varying distances or pitch along the length and about either side of a transverse center plane, as depicted in FIG. 5. In addition, the winding direction is reversed on either side of the transverse center plane to produce a mirror-image, symmetrical structure with respect to a transverse XY plane. Thus, coil 30 will include a wound conductor 108, such as a copper wire, rod or bar, supported on a cylindrical support structure 110.

Figure 6:
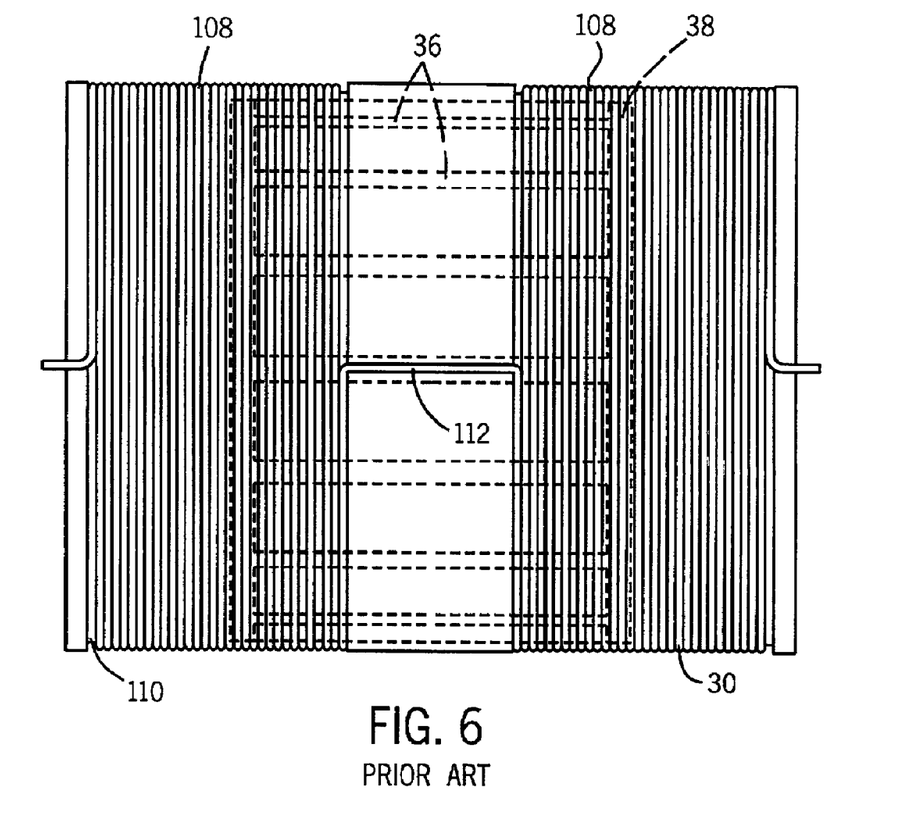
FIG. 6 is a side view of a Z-axis gradient coil disposed about a rf coil as is known in prior systems.

In practice, the above described techniques work adequately in numerous MR imaging systems. However in systems incorporating ultra-short cylindrical magnets the conventional winding of the Z-axis coil conductors may lead to a variety of problems. Such an ultra-short system is depicted in FIG. 6, which illustrates the reduced inter-winding spacing of the wound conductor 108 comprising the Z-axis gradient coil 30, and the resulting reduction in pitch and pitch variability, compared to non-short systems. In an ultra-short system of the type depicted the inter-winding spacing may be in the range of 1.5 mm. This drastic reduction in inter-winding spacing is necessary to maintain power efficiency and linearity of the gradient field. However, while the high-density winding in such an ultra-short system increases power efficiency, it also makes it difficult to obtain sufficient decoupling of the Z-axis gradient coil 30 and the birdcage rf coil 34 in the absence of an interposed shield.

Biot Savart calculations confirm that, theoretically, inductive coupling between the birdcage rf coil 34 and the Z-axis gradient coil 30 should not occur due to the configuration of the coils. In particular, a birdcage rf coil 34 primarily generates an rf field in the radial direction and no net flux in the direction of the Z-axis when integrated over the coil. In the Z-axis gradient coil 30, the current distribution is anti-symmetric about the origin. Therefore, in theory, the birdcage rf coil 34 will not couple inductively with a solenoidal coil, such as the Z-axis gradient coil 30, provided that the birdcage rf coil 34 is radially and longitudinally centered inside the Z-axis gradient coil 30. In ultra-short systems, however, the distance between the conductors of the birdcage end rings 38 and the wound gradient conductors 108 may be as little as 10 mm, requiring alignment accuracy to be a fraction of a millimeter, a virtual impossibility in practice. Misalignment results in residual coupling between the birdcage rf coil 34 and the Z-axis gradient coil 30, leading to a low quality factor, or Q, and an associated loss of efficiency. It is therefore desirable to optimally wind the Z-axis gradient coil conductors 108 such that the interaction between the birdcage rf coil 34 and the Z-axis gradient coil 30 is minimized.

Figure 7:
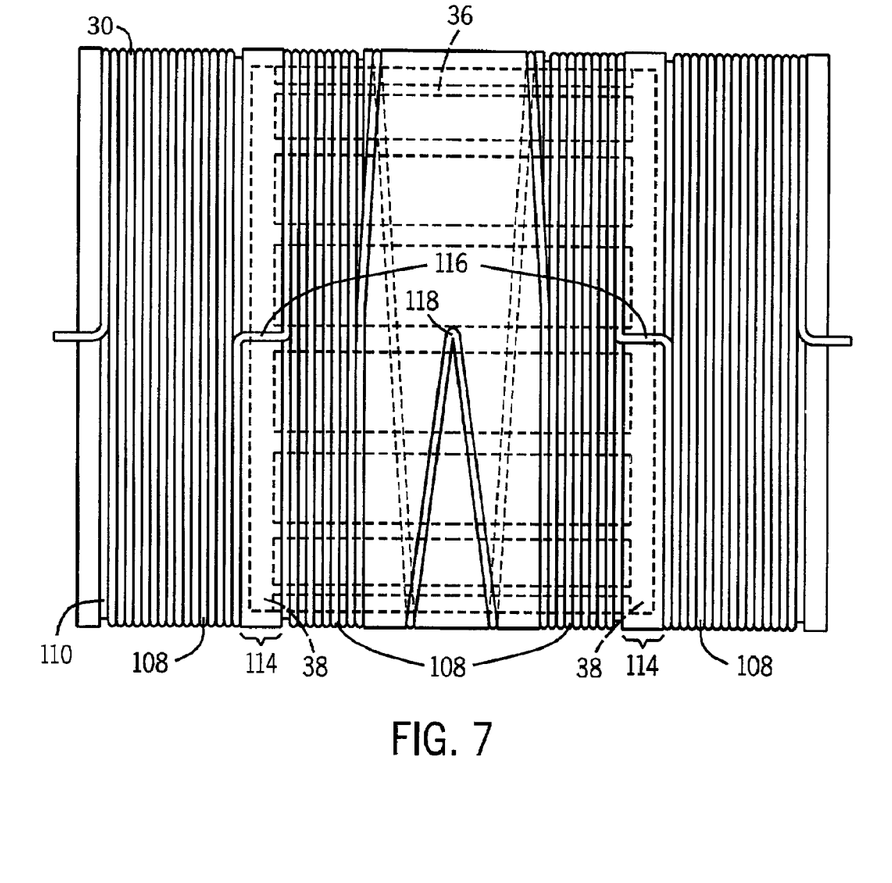
FIG. 7 is a side view of a Z-axis gradient coil disposed about a rf coil in accordance with certain aspects of the present technique.

With reference to FIG. 6, two aspects of the conventional winding of a Z-axis gradient coil 30 have been found to contribute to the reduction of the Q of the birdcage rf coil 34. First, the portion of wound conductor 108 disposed above the end ring 38 of the birdcage rf coil 34 produces residual coupling, thereby reducing the Q associated with the system. Referring now to FIG. 7, this problem is addressed by winding the Z-axis gradient coil 30 such that there is an end ring gap 114 above each end ring 38. The Q of the birdcage rf coil 34 is now measured as a function of the width of end ring gap 114. A gap wire 116 spans the end ring gap 114 to connect the portions of wound conductor 108 on either side of gap 114. Gap wire 116 may be of any configuration however, in one embodiment, it is straight. This straight configuration allows gap 114 to be bridged with a minimum of gap wire 116 above gap 114 and is the embodiment depicted in FIG. 7. Presenting a minimum of gap wire 116 above gap 114 is believed to minimize negative effects upon the Q of the birdcage rf coil 34. Gap 114 may be either narrower or wider than end ring 38, however in one embodiment, an end ring 38 which is one inch wide and a gap 114 which is two inches wide has been found to produce acceptable results.

In addition, referring once again to FIG. 6, the straight connector wire 112 connecting the symmetric positive and negative portions of the Z-axis gradient coil 30 causes the Q of the birdcage rf coil 34 to vary with the azimuthal position of the connecting wire. In particular, the use of a straight wire to connect the symmetric portions of the Z-axis gradient coil 30 results in birdcage rf coil 34 producing elliptically polarized fields as opposed to the desired circular polarized fields. As a result, Q varies with the angle between birdcage rung 36 and the connector wire 112 such that every time the connector wire 112 passes over one of the rungs 36, Q drops.

Referring once again to FIG. 7, this problem is addressed by using a spirally wound connector 118 to connect the positive and negative portions of the Z-axis gradient coil 30 across the isocenter. Any coupling between the birdcage rf coil 34 and the Z-axis gradient coil 30 which results from spirally wound connector 118 is equally distributed among the rungs 36 of the birdcage rf coil 34. Though FIG. 7 depicts a spirally wound connector 118 which encircles the rf coil 34 once and then reverses, those skilled in the art will understand that the spirally wound connector 118 may simply undergo a half-revolution or any multiple thereof, i.e. 180°, 360°, 540°, 720°, before reversing. This use of half-revolution spirals in the gradient coil 30 is feasible, combined with the homogeneous mode of the rf coil 34, due to the tendency of opposing rungs to operate at the same current amplitude but with 180 degree phase difference, thereby spreading any coupling between all of the rungs. Due to the use of spirally wound conductor 118, either the Z-axis gradient coil 30 or the birdcage rf coil 34 can rotate about the Z-axis without changing the Q of the birdcage rf coil 34. Use of these winding techniques preserve a high Q factor associated with the birdcage rf coil 34 while allowing the use of a gradient embedded shield in ultra-short systems.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A coil for use with a whole body rf coil of a MR imaging system, the coil comprising a conductor wound as a solenoid coil in which the winding is reversed at a transverse plane located at the isocenter of a field generated by the coil to form a first winding and a reversed, second winding, and further comprising a pair of gaps, one on either side of the transverse plane, wherein each gap is situated so that the solenoid coil is not wound above a pair of end rings of the whole body rf coil and wherein a minimum amount of conductive material crosses each gap.

2. The gradient coil of claim 1, further comprising a spirally wound segment which transitions the first winding to the second winding at the transverse plane and which passes around the whole body rf coil at least one half of a turn prior to reversing.

3. The gradient coil of claim 2, wherein the spirally wound segment passes around the whole body rf coil in multiples of one half of a turn prior to reversing.

4. The gradient coil of claim 2, wherein the spirally wound segment of the conductor is disposed about the whole body rf coil such that coupling between the whole body rf coil and the spirally wound segment is distributed substantially evenly over the whole body rf coil.

5. The coil as recited in claim 1, wherein the minimum amount of conductive material comprises a linear segment of conductive material.

* * * * *